United States Patent [19]
Ariki

[11] Patent Number: 5,925,141
[45] Date of Patent: Jul. 20, 1999

[54] SEMICONDUCTOR MEMORY DEVICE WITH DATA SCRAMBLE CIRCUIT

[75] Inventor: Takuya Ariki, Tokyo, Japan

[73] Assignee: Mitsubishi Denki Kabushiki Kaisha, Tokyo, Japan

[21] Appl. No.: 08/904,593

[22] Filed: Aug. 1, 1997

[30] Foreign Application Priority Data

Feb. 4, 1997 [JP] Japan ............................... P09-021348

[51] Int. Cl.⁶ ............................ G11C 29/00; G01R 31/28
[52] U.S. Cl. ........................... 714/718; 714/738; 365/201
[58] Field of Search ................................. 371/21.1, 21.3,
371/27.1, 27.2, 27.3, 27.4, 27.5; 365/200,
201; 364/256, 256.2, 963.2, 956.4, 956.6;
711/104, 202, 209

[56] References Cited

U.S. PATENT DOCUMENTS

| | | | |
|---|---|---|---|
| 5,287,481 | 2/1994 | Lin | 395/425 |
| 5,844,913 | 12/1998 | Hassaum et al. | 371/21.1 |
| 5,854,801 | 12/1998 | Yamada et al. | 371/27.1 |

FOREIGN PATENT DOCUMENTS 5-282900  10/1993  Japan.
7-282599  10/1995  Japan.

*Primary Examiner*—Trinh L. Tu
*Attorney, Agent, or Firm*—McDermott, Will & Emery

[57] ABSTRACT

The semiconductor memory device of the present invention comprises a mode setting means for setting the test mode; a circuit for transferring data provided to one of the input/output pins in a group of a given number of input/output pins to each of the rest of the group when the test mode is set; a circuit provided for each input/output pin which, when the test mode is set, selectively inverting the data signal values provided to the input/output pins or retrieved from the memory cells so that the order of the specified logical addresses coincides with the order of the physical addresses of the memory cells; and a circuit for deciding whether or not the data reading operation has been properly performed from the data retrieved from the memory cells to the given number of input/output pins and for sending out a signal indicating the decision to one of the input/output pins in the group of the given number of input/output pins.

13 Claims, 9 Drawing Sheets

SEMICONDUCTOR MEMORY DEVICE WITH DATA SCRAMBLE CIRCUIT

BACKGROUND OF THE INVENTION

1. Field of the Invention

The present invention relates to a technology effective for the device testing of semiconductor memory devices.

2. Description of the Prior Art

The testing of a semiconductor memory device such as a dynamic random access memory (DRAM) and the analysis of its defective bits are performed by connecting each of the input and output pins of the semiconductor memory device to a memory tester to write data to and read data from each of individual memory cells of the semiconductor memory device.

Recent enhancement of the memory capacity (an increase in the number of the memory cells) of the semiconductor memory device due to progress in technology has significantly increased the cost of testing the device. Typically, in order to reduce the cost, a circuit dedicated only to testing but not used for ordinary operations is built into the semiconductor memory device.

Further, particularly in the DRAM market, demand of multiple bits has been strong, and the multiple bits of x8 and x16 are the main stream of the current DRAM market. The multiple bit technology causes an increase in the number of pins of the device, which, in turn, causes an increase in the number of pins of the tester. If the device has more pins according to the multiple bit technology, the tester will test a lesser number of devices per unit time if the tester has a fixed number of pins, thus resulting in a higher cost of testing. One solution for this problem is to build a circuit in the device which is dedicated to testing and is capable of degenerating four input/output pins, for example, to one pin. That is, if the device is x16, this circuit makes the device look as if it is an x4 device. The device with this circuit therein, therefore, can be tested four times as fast as the device without this circuit and, accordingly, very economically.

The memory cells of the aforementioned semiconductor memory device are built densely packed so that the area of the chip is minimal. Accordingly, physical bit positions in the chip and the data stored there have no direct sequential correspondence to logical address values and logical data values provided from an external device. However, in actual testing it is often desirable to store data at a specified physical memory address. In order to negotiate the difference between the logical values and the physical values, the address scramble and the data scramble processes are often performed. Typically a memory tester is equipped with a software program for the address scramble and the data scramble processes. The memory tester equipped with this kind of software program performs the scramble process appropriate to the tested chip, provides signals processed by the scramble process to the device, and carries out a physical test on the device and analyzes the resulting data.

However, the semiconductor memory device equipped with the circuit which is dedicated to testing and reduces four input/output pins into one pin can not be tested with an external tester which scrambles data using the software, if the data scramble logic to be processed by the four input/output pins are not the same. Because the data cannot be written to or read from a desired physical address.

SUMMARY OF THE INVENTION

An essential object of the present invention is therefore to provide a semiconductor memory device capable of executing a memory test using an on-chip data scramble circuit.

Another object of the present invention is to provide a semiconductor memory device capable of executing a memory test even if test data are input to input/output pins specified among all of them.

In order to achieve these objects, according to the present invention, there is provided a semiconductor memory device comprising a test mode set means for setting a memory test mode and a data scramble circuit for executing the test mode, when set by the test mode set means, by selectively inverting values of data externally input via input/output pins of the memory device in accordance with physical addresses corresponding to the logic addresses, and upon reading data stored in said memory cell array, re-inverting inverted data based on the corresponding physical address information.

The data scramble circuit desirably is comprised of an input data scramble circuit for selectively inverting values of the input data in accordance with physical addresses corresponding to the input logical addresses, and an output data scramble circuit for re-inverting values of the data inverted by said input data scramble circuit upon reading the data stored in said memory cell array.

It is desirable to provide the input data scramble circuit and output data scramble circuit for each of input/output pins of the memory device.

The data scramble circuit may be comprised of one or more logic circuits which determine the data should be inverted or re-inverted in accordance with the corresponding physical address thereof.

Further, the present invention is suitably applicable to a semiconductor memory device having a number of input/output pins among which test data are given to a limited number of input/output pins. In order for that, the semiconductor memory device of the present invention further comprises a data input control circuit for transferring data provided to one of the input/output pins in a group of a given number of input/output pins to each of the rest of the group when test mode is set. In this case, the input data scramble circuit executes a data scramble for data given by the data input control circuit.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF PREFERRED EMBODIMENT

A preferred embodiment of the present invention will be described with reference to the drawings.

The semiconductor memory device of the present invention can reduce a plural number of input/output pins into a single input/output pin. The device comprises a scramble circuit therein dedicated to the device test so that the device can perform the scramble process by itself without a help of the software scramble process of the tester. The scramble circuit includes circuits each of which independently performs a suitable scramble process on the data provided to an individual input/output pin. This allows for writing of a desired test pattern in the memory cells even when the number of input/output pins are reduced. Embodiments 1–3 of the semiconductor memory device characterized as above will be described below.

Embodiment 1

Figure 1:
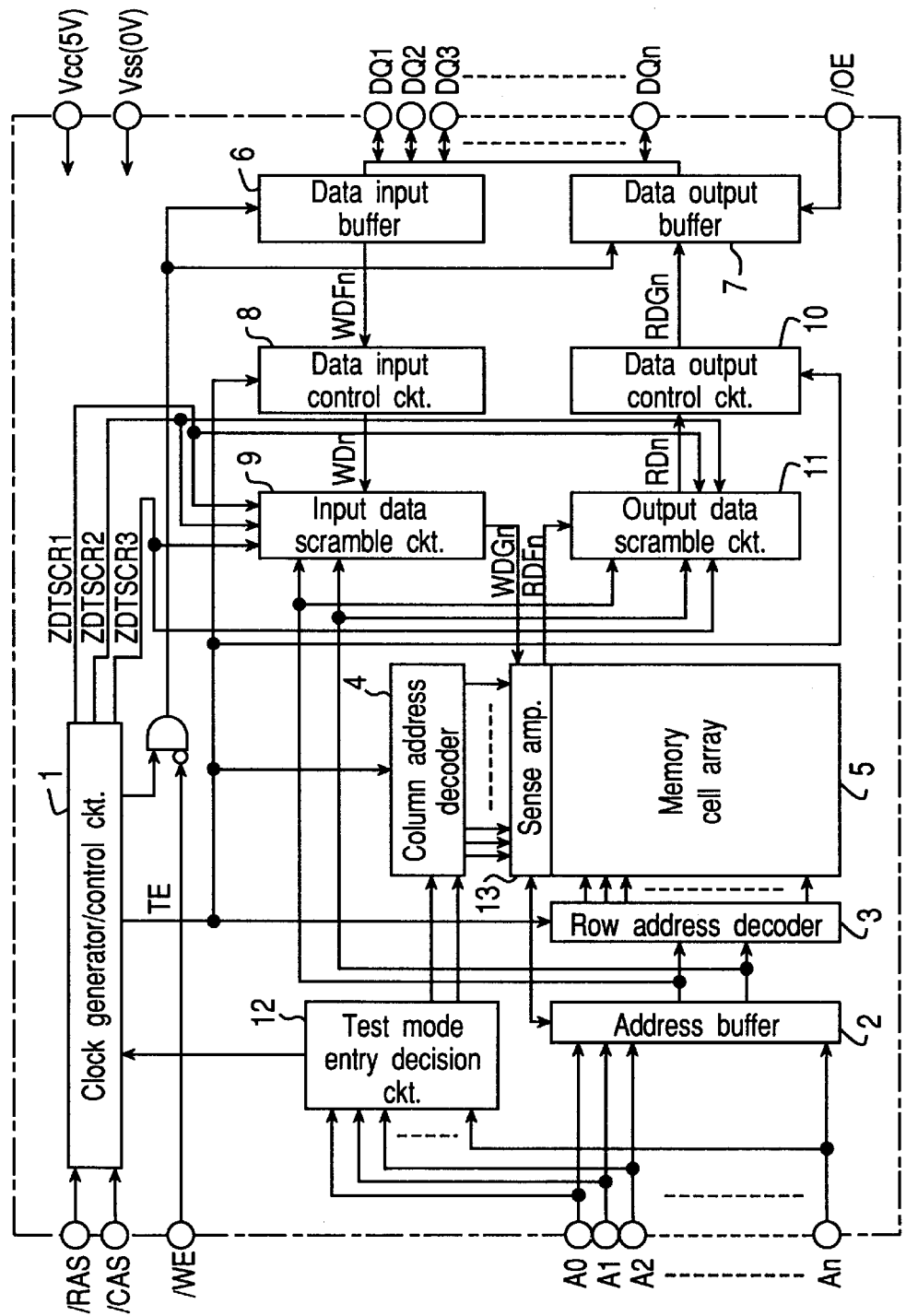
FIG. 1 shows a configuration of the DRAM according to Embodiment 1 of the semiconductor device of the present invention.

FIG. 1 is a block diagram showing the configuration of the DRAM according to Embodiment 1 of the semiconductor memory device of the present invention. A clock generator/control circuit 1 generates a clock signal and control signals necessary to the internal operations of the DRAM responding to externally provided $\overline{RAS}$ and $\overline{CAS}$ control signals.

An address buffer 2 temporarily stores address data provided through address input/output pins A0–An.

A row address decoder 3 decodes an address signal provided by the address buffer 2 into an internal address and activates a corresponding word line in a memory cell array 5.

A column address decoder 4 decodes an address signal provided by the address buffer 2 into an internal address and produces a signal for retrieving data from the memory cell specified with the activated word line.

A sense amplifier 13 amplifies data signals read from the memory cell array 5 or externally provided data signals to be written to the memory cell array 5.

A test mode entry decision circuit 12 normally outputs an "L" signal to the clock generator/control circuit 1, but, responding to a special externally provided address signal, it sends an "H" signal to the clock generator/control circuit 1 in order to set the test mode for the device in which the device is connected to a tester (not shown) for generating a test pattern.

Responding to the "H" signal from the test mode entry decision circuit 12, the clock generator/control circuit 1 sends an "H" signal, referred to as a TE drive signal, to the row address decoder 3, the column address decoder 4, a data input control circuit 8, and a data output control circuit 10 to switch their circuit modes. The clock generator/control circuit 1 outputs control signals ZDTSCR 1–3 which specify patterns of scrambled data (a pattern of data written in a memory cell) to an input data scramble circuit 9 and an output data scramble circuit 11.

A data input buffer 6 temporarily stores data provided through address input/output pins DQ1–DQn.

When the data input control circuit 8 receives a data signal WDFn from the data input buffer, it outputs, in the normal operation mode, the same signal without change, which is referred to as WDn. When the data input control circuit 8 is in the test mode, however, it reduces four input/output pins into one input/output pin. In other words, in the test mode, test data generated according to a desired test pattern are input from the tester to one input/output pin for every four input/output pins. For example, receiving a data signal WDF1 through the input/output pin DQ1, it outputs the same signal as data signals WD1–WD4.

The input data scramble circuit 9 receives a data signal WDn from the data input control circuit 8 and outputs, in the normal operation mode, the same signal without change which is referred to as WDGn. When the input data scramble circuit 9 is in the test mode, however, it performs an appropriate scramble process on the data received through each pin and sends out a data signal referred to as WDGn. The scramble process is performed by selectively inverting the data received through each pin so that the order of the logical addresses sent to the memory cell 5 coincides with the order of the physical addresses thereof. In other words, the input data are scrambled in accordance with physical addresses of the memory cell array so that a desired pattern is written into the memory cell array. This scramble process thus writes a specific pattern of "H" and "L" in the memory cell array 5.

The output data scramble circuit 11 receives a data signal RDFn from the memory cell array 5 and sends out, in the normal operation mode, the same signal without change which is referred to as RDn. When the output data scramble circuit 11 is in the test mode, however, it decodes the scrambled data signal RDFn from the memory cell array 5 and outputs the decoded data as RDn.

The data output control circuit 10 receives a data signal RDn from the output data scramble circuit 11 and outputs, in the normal operation mode, the same signal without change which is referred to as RDGn. When the data output control circuit 10 is in the test mode, however, it determines whether or not the specified memory cell properly operates by checking every four signals RD1–RD4 and produces a data signal RDG1 which indicates what the decision is for that memory cell.

The data buffer 7 outputs data to input/output pins DQ1–DQn.

Figure 2:
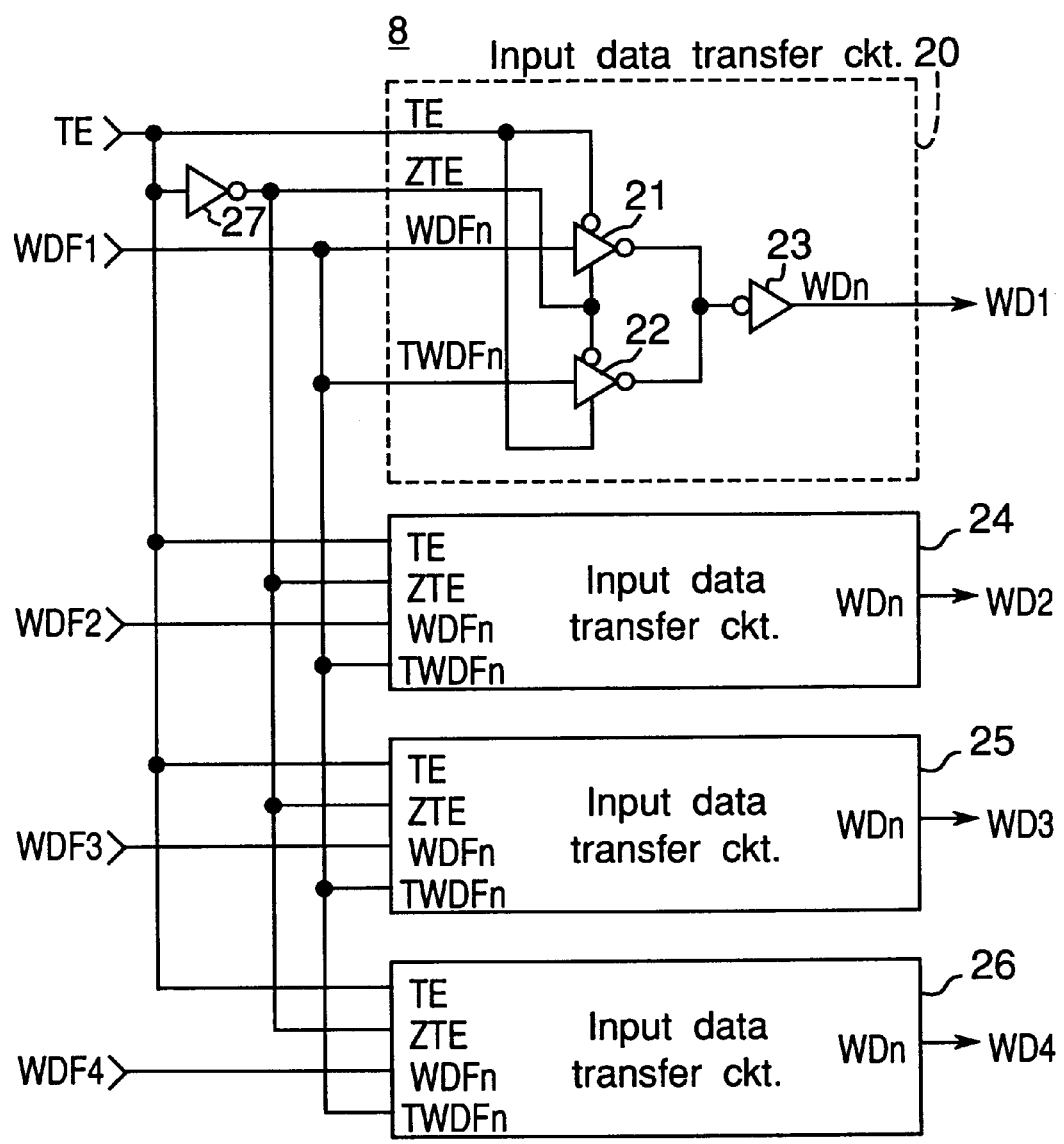
FIG. 2 shows a configuration of the data input control circuit.

FIG. 2 shows a block diagram of the data input control circuit 8. This circuit receives the data signals WDF1–WDF4 from four terminals through the data input buffer 6 and the drive signal TE from the clock generator/control circuit 1. The data input control circuit 8 reduces four input/output pins into one input/output pin when the drive signal TE from the clock generator/control circuit 1 is "H". This reduces the number of pins used in the memory test to one fourth of the number and accordingly increases the number of devices four times which can be simultaneously tested.

The data input control circuit 8 comprises four input data transfer circuits 20, 24, 25, and 26. These four input data transfer circuits 20, 24, 25, and 26 have the same configuration which receives the drive signal TE and its inverted signal ZTE inverted by an inverter 27. All the input terminals WDFn of the input data transfer circuits 20, 24, 25, and 26 receive the data signal WDF1, WDF2, WDF3 and WDF4, respectively while each of the input terminals TWDFn of the input data transfer circuits 20, 24, 25, and 26 receives the same data signal WDF1.

Referring to FIG. 2 the configuration and operation of the input data transfer circuits will be described taking the input data transfer circuit 20 as an example. This circuit 20 comprises two clocked CMOS 21 and 22 and one inverter 23. When the drive signal TE is "H" and accordingly the signal ZTE is "L", which represents the test mode, the clocked CMOS 22 is enabled. Therefore, the signal WDF1 received at the terminal TWDFn is output through the output terminal WDn. On the other hand, when the drive signal TE is "L" and the signal ZTE is "H", that is when the circuit is not in the test mode, the clocked CMOS 21 is enabled. Thus the signal WDF1 received at the terminal WDFn is output through the output terminal WDn.

The input data transfer circuit 24 outputs the signal WDF2 when the drive signal TE is "L" while it outputs the signal WDF1 when the drive signal TE is "H". Similarly, the input data transfer circuit 25 outputs the signal WDF3 when the drive signal TE is "L" while it outputs the signal WDF1 when the drive signal TE is "H". Also, the input data transfer circuit 26 outputs the signal WDF4 when the drive signal TE is "L" and the signal WDF1 when the drive signal TE is "H".

The input data transfer circuits with the configuration shown in FIG. 2, therefore, transfer, in the normal mode, the data signals WDF1–WDF4 received at four input/output pins to the input data scramble circuit 9 without change. In the test mode (the drive signal TE is "H"), however, the output signals WD1–WD4 of the data input control circuit 8 take on the same signal WDF1 received at one input/output pin. Thus the four input/output pins are reduced to one input/output pin.

Figure 3:
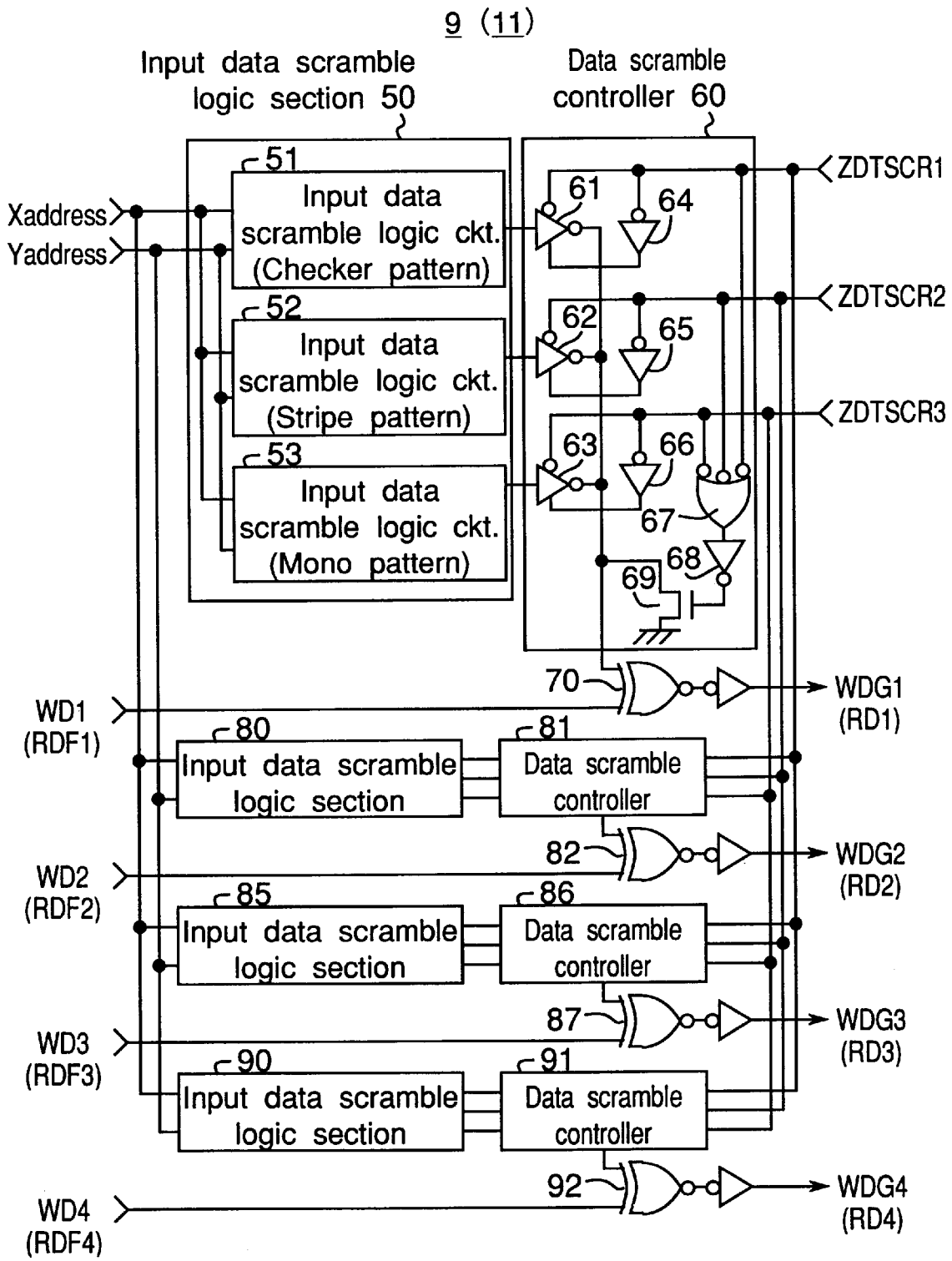
FIG. 3 shows a circuit configuration of the input data scramble circuit.

FIG. 3 shows a block diagram of the input data scramble circuit 9. The input data scramble circuit 9 carries out the scramble process on the input signals WD1–WD4 so that the signals are written in the memory cell array 5 in a desired pattern of "H" and "L" (checker, stripe, or mono pattern). As mentioned above the input data WD1–WD4 are all DF1 when the test mode is activated. Also, in the test mode the data signal WDF1 is fixed to either "H" or "L". The input data scramble circuit 9 comprises four input data scramble logic sections 50, 80, 85, and 90 and four data scramble controllers 60, 81, 86, and 91 of the same configuration. The input data scramble logic sections 50, 80, 85, and 90 produce three different kinds of scrambled data depending on the values of the X and Y addresses. The scramble process selectively inverts the values of the input data signals WD1–WD4 so that the order of the logical addresses coincides with that of the physical addresses in the memory cell array 5. The data scramble controllers 60, 81, 86, and 91 feed EXOR gates 70, 82, 87, and 92, respectively, at one of the terminals with the desired scrambled data selected from the three kinds of scrambled data provided by the input data scramble logic sections 50, 80, 85, and 90, respectively. The selection is done by setting one of the control signals ZDTSCR1–3 from the clock generator/control circuit 1 to "H". The other terminals of the EXOR gates 70, 82, 87, and 92 are fed with the data signals WD1–WD4 respectively. The EXOR gates 70, 82, 87, and 92 perform the scramble process on the input data signal WD1–WD4. That is, if the scramble data provided by the data scramble controller is "H", the EXOR gate outputs the data signal referred to as WDGn which is an inverted signal of the input data signal WDn. If the scramble data provided is "L", however, the EXOR gate outputs the same input data signal WDn without change as WDGn.

Figure 4A:
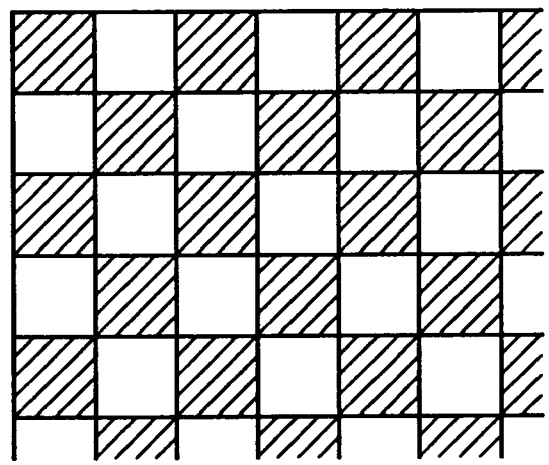
FIGS. 4A, 4B, and 4C show patterns which are written in the memory cell array.
Figure 4B:
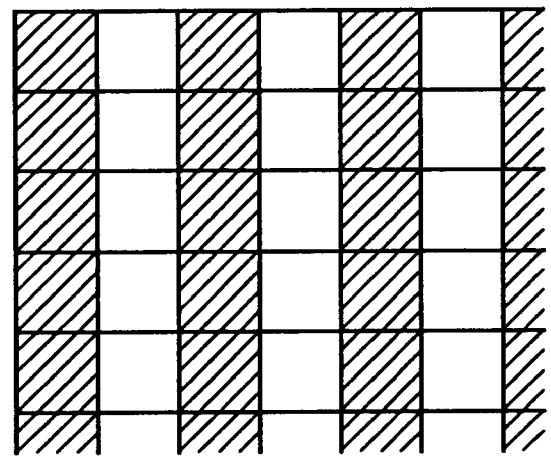
Figure 4C:
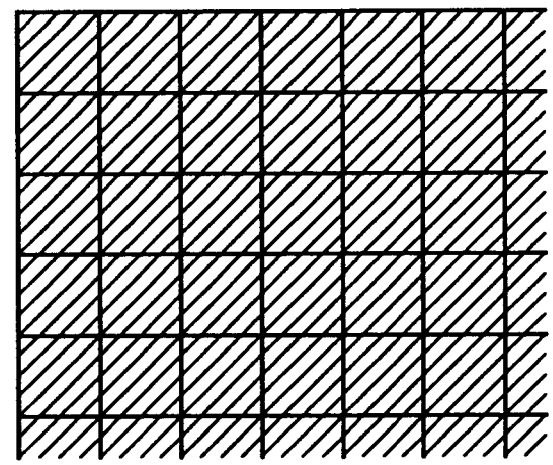

Referring to FIG. 3 the configuration of the input data scramble logic section 50 will be described. The logic section 50 comprises three logic circuits 51, 52, and 53. Depending on the input X and Y addresses the logic circuit 51 outputs appropriate scramble data which produces a checker flag pattern of "H" and "L" in the memory cell array 5 as shown in FIG. 4A. Depending on the input X and Y addresses the logic circuit 52 outputs appropriate scramble data which produce a stripe pattern of "H" and "L" in the memory cell array 5 as shown in FIG. 4B. The logic circuit 53 outputs fixed data, either "H" or "L" depending on the input X and Y addresses to make a uniform pattern of "H" or "L" in the memory cell array 5 as shown in FIG. 4C. The relationship between the logical addresses and the physical addresses for a particular device and a particular input/output pin defines the configuration of the input data scramble logic circuit. Therefore, each of the input data scramble logic sections has input data scramble logic circuits most suitable to it. This allows for appropriate scramble processes for the four input/output pins.

Figure 5:
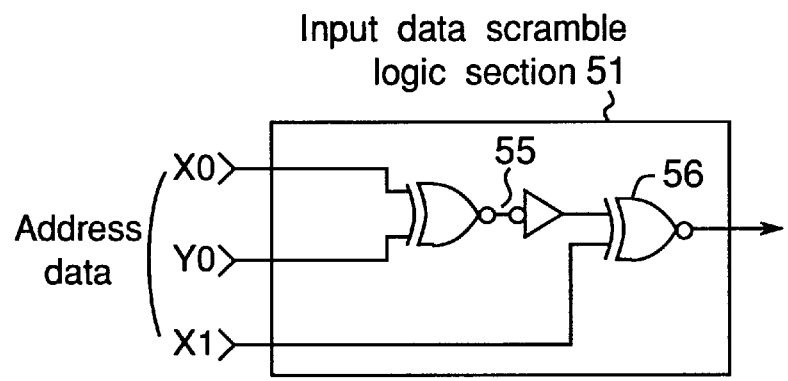
FIG. 5 is a circuit diagram of the input data scramble logic circuit.

FIG. 5 is a circuit diagram of the input data logic circuit 51. The EXOR gate 55 in the diagram produces an exclusive-OR from the least significant bit X0 of the X address and the least significant bit Y0 of the Y address which are provided to the circuit. The EXOR gate 56 produces an exclusive-OR from the output of the EXOR gate 55 and the second least bit X1 of the X address. This exclusive-OR value from the EXOR gate 56 is output as scrambled data which controls whether data should be written at a physical address corresponding to an input logical address.

Referring back to FIG. 3 we will explain the circuit of the data scramble controller 60. The data scramble controller 60 comprises three clocked CMOS 61, 62, and 63, which are respectively controlled by ZDTSCR1–3 provided by the clock generator/control circuit 1. The clock generator/control circuit 1 sets ZDTSCR1 at "L" and ZDTSCR2 and 3 at "H", when the input data scramble logic circuit 51 is selected. In this case the clocked CMOS 61 becomes enabled and the scrambled data generated by the input data scramble logic circuit 51 (a checker pattern of "H" and "L") is sent to an input terminal of an EXOR gate 70.

When the input data scramble logic circuit 52 is used, ZDTSCR2 is set at "L" and ZDTSCR1 and 3 at "H". In this case the clocked CMOS 62 becomes enabled and the scrambled data generated by the input data scramble logic circuit 52 (a stripe pattern of "H" and "L") is sent to the input terminal of an EXOR gate 70.

Likewise when the input data scramble logic circuit 53 is used, ZDTSCR3 is set at "L" and ZDTSCR1 and 2 at "H". In this case the clocked CMOS 63 becomes enabled, and the scrambled data generated by the input data scramble logic circuit 53 (a mono pattern of "H" or "L") is sent to an input terminal of the EXOR gate 70.

The EXOR gate 70 inverts data signal WD1 and outputs it as data signal WDG1 if the scramble data from the data scramble controller 60 is "H" while it outputs data signal WD1 without change as data signal WDG1 if the scramble data from the data scramble controller 60 is "L".

When control signals ZDTSCR1–3 are all "H", that is, when the test mode is not set, an "H" signal is provided to the gate of the MOS transistor 69 through a three-input AND gate (three-input NAND gate 67 plus an inverter 68 in the figure). The "H" signal activates the MOS transistor 69 and makes the output of the data scramble controller 60 "L". Accordingly the input signal WD1 to the EXOR gate 70 is output therefrom without change as WDG1.

The output data scramble circuit 11 has the same configuration as the input data scramble circuit 9 shown in FIG. 3, where input and output data for the output data scramble circuit 11 are indicated in parentheses. That is, the EXOR gates 70, 82, 87, and 92 receive data signals RDF1–RDF4 instead of WD1–WD4 and send out data signals RD1–RD4 instead of WDG1–WDG4, respectively.

In a test method such as the present embodiment where four input/output pins are reduced to one input/output pin, four data retrieved from the memory cell 5 are compared and a decision is made which is then output to the input/output pin. When the test mode is set and the read and write operations for the memory cell 5 are properly performed, data signals RD1–RD4 provided to the data output control circuit 10 can be either "H" or "L". In the test mode the data output control circuit 10 compares the four data signals RD1–RD4 to decide if the read and write operations are properly performed. The decision is sent out as data signal RDG1. When the test mode is not set, the data signals RD1–RD4 from the output data scramble circuit 11 are sent out without change as data signal RDG1–4 to the data output buffer 7.

Figure 6:
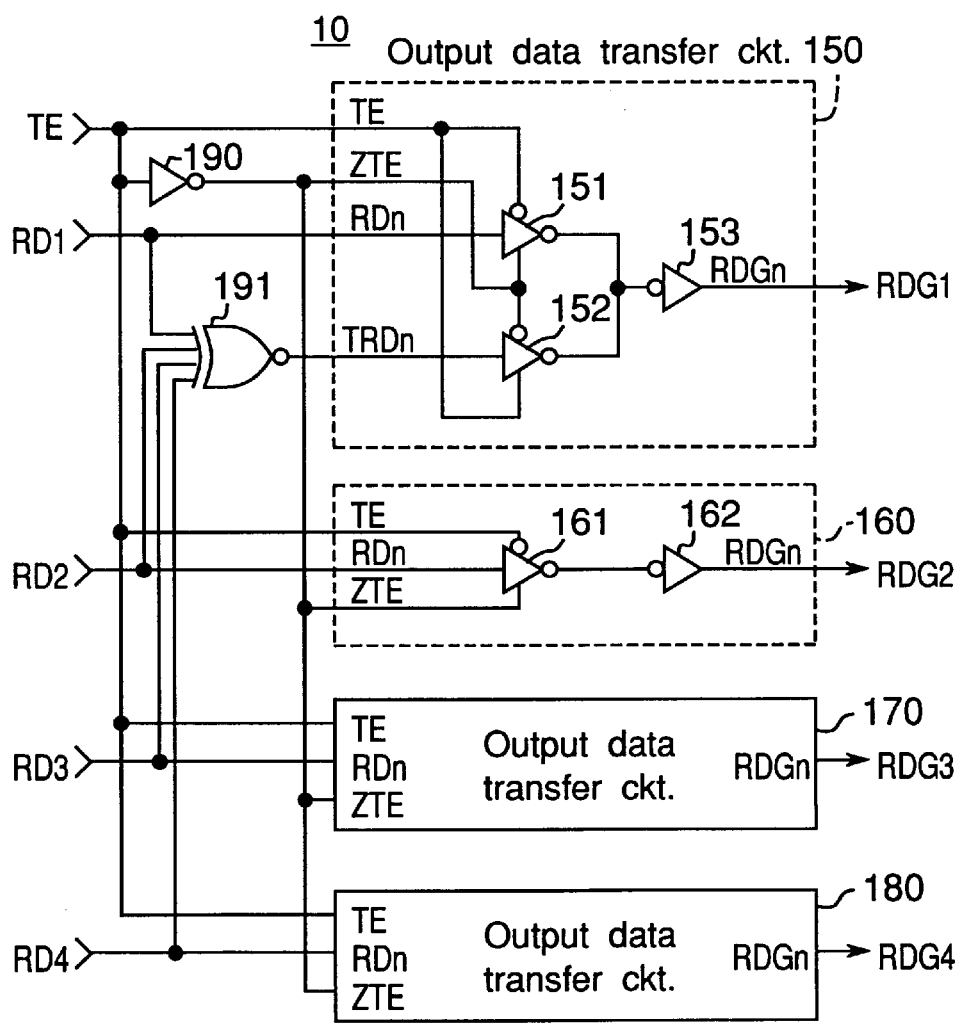
FIG. 6 shows a configuration of the output data scramble circuit.

The configuration and operation of the data output control circuit 10 will be described next. FIG. 6 is a circuit diagram of the data output control circuit 10 having four output data transfer circuits 150, 160, 170 and 180. The output data transfer circuit 150 receives the drive signal TE, the inversion signal ZTE produced from TE by an inverter 190, retrieved data signal RD1, and a decision signal TRDn from a data comparator 191 comprising an EXNOR gate. The drive signal TE and the inversion signal ZTE control two clocked CMOS 151 and 152. When the drive signal TE is "H", that is, when the test mode is set, the clocked CMOS 152 is enabled, and the decision signal from the data comparator 191 is output as a data signal RDG1. The data comparator 191 comprises an EXNOR gate with four input terminals. If every data signal RD1–RD4 is either "H" or "L", the data comparator 191 outputs a data signal TRDn which is "H". The inverter 153 inverts the data signal TRDn and outputs it as a data signal RDG1 which indicates the decision.

When the drive signal TE is "L", that is, when the test mode is not set, the clocked CMOS 151 is enabled, and a data signal RD1 is output without change as a data signal RDG1. Since the signals produced by the clocked CMOS 151 and 152 are then inverted by the inverter 153, the signals output from the data output control circuit 10 are the same as the signals provided to it.

The output data transfer circuit 160 receives the drive signal TE, the inversion signal ZTE produced from TE by an inverter 190, and a retrieved data signal RD2. The output data transfer circuit 160 comprises one clocked CMOS 161 and an inverter 162, When the drive signal TE is "H", that is, when the test mode is set, the clocked CMOS 161 is disabled, and the data is not transmitted. When the drive signal TE is "L", that is, when the test mode is not set, however, the clocked CMOS 161 is enabled, and a data signal RD2 is output without change as a data signal RDG2.

Similarly, the output data transfer circuit 170 does not transmit a signal when the test mode is set while it outputs a data signal RD3 as RDG3 when the test mode is not set. The output data transfer circuit 180 does not transmit a signal when the test mode is set while it outputs a data signal RD4 as RDG4 when the test mode is not set. The operations of the output data transfer circuits 170 and 180 will not be given since they have the same configuration as the output data transfer circuit 160.

Embodiment 2

Figure 7:
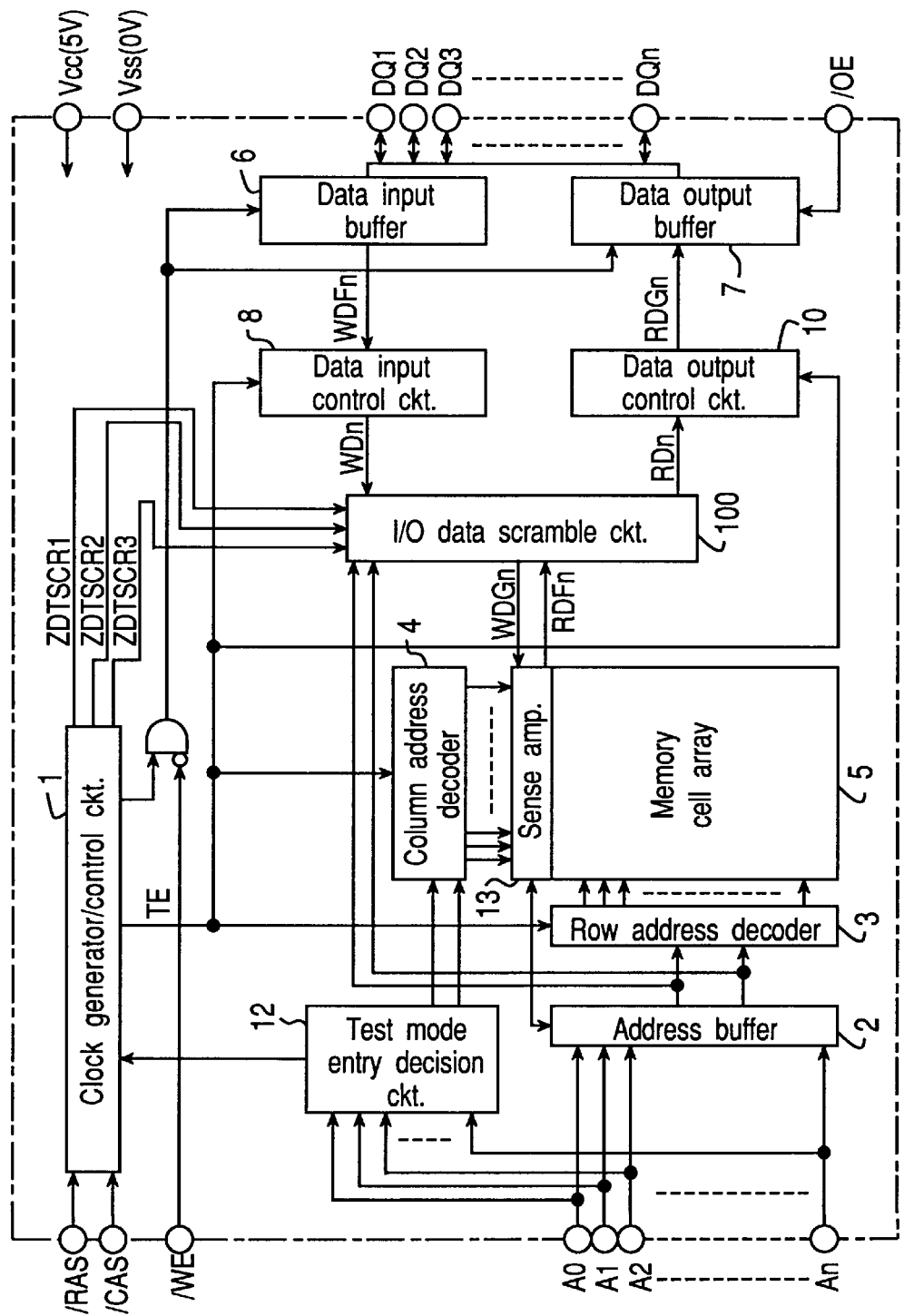
FIG. 7 shows a configuration of the DRAM according to Embodiment 2 of the semiconductor memory device of the present invention.

FIG. 7 is a block diagram showing the configuration of the DRAM of Embodiment 2 of the semiconductor memory device of the present invention. The like reference numerals in FIGS. 1 and 7 indicate the same components. The DRAM of Embodiment 1 has separate scramble circuits 9 and 11 for input and output data. As mentioned above, referring to FIG. 3, the data input scramble circuit and the output data scramble circuit are identical. In the DRAM of the present embodiment, the scramble logic sections and scramble controllers in FIG. 3 are used for both the input data scramble circuit 9 and the output data scramble circuit 11. The scramble circuit of the present embodiment, therefore, is referred to as an input/output data scramble circuit 100.

Figure 8:
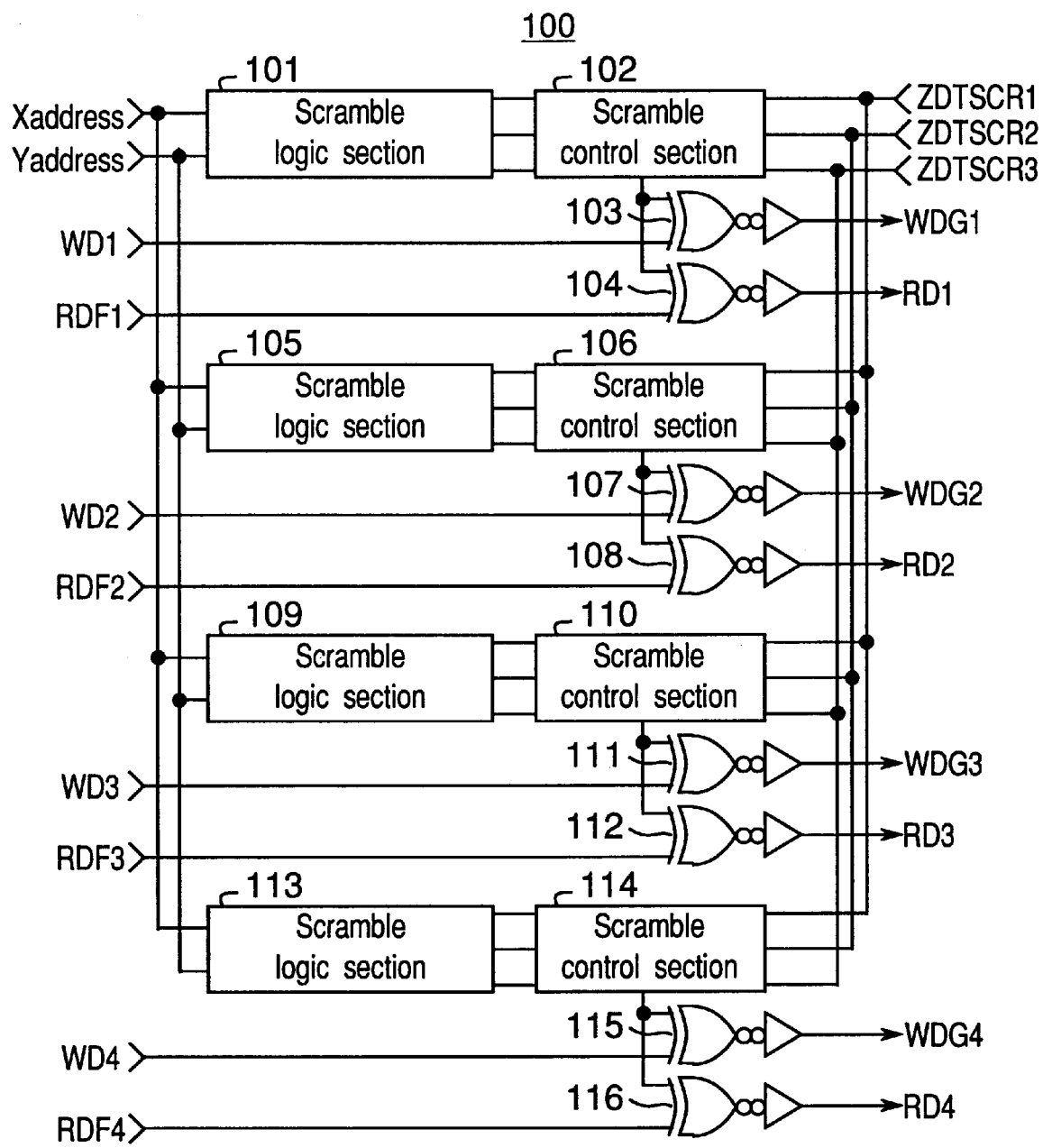
FIG. 8 shows a configuration of the input/output data scramble circuit.

FIG. 8 shows a block diagram of the input/output data scramble circuit 100. The scramble logic portions 101, 105, 109, and 113 have the same configuration as the scramble logic portion 50 shown in FIG. 3. Further, scramble controllers 102, 106, 110, and 114 are the same as the data scramble controller 60 also shown in FIG. 3. This circuit includes not only EXOR gates 103, 107, 111, and 115 which receive input data signals WD1–WD4 respectively but also another EXOR gates 104, 108, 112, and 116 which receive output data signals RDF1–RDF4 respectively. The scramble data from the scramble controllers 102, 106, 110, and 114 are provided to the other terminals of the EXOR gates as shown in FIG. 8. This embodiment gives rise to a simpler circuit and reduces the chip area needed to make the device. Since the circuit configuration and the operation of the input/output data scramble circuit is the same as the input data scramble circuit 10 [sic] and the output data scramble circuit 11, further description will not be given.

Embodiment 3

The read time and write time (access time) at the normal operation mode are important parameters in semiconductor memory devices. In particular fast read time is desirable. In the DRAMs disclosed in Embodiments 1 and 2, all data must go through the scramble circuits when the data is written or read even when the test mode is not set. As shown in FIGS. 3 and 8 data is read or written through the EXOR gates which have relatively long delay times. Therefore the access times for Embodiments 1 and 2 are expected to be relatively long.

Figure 9:
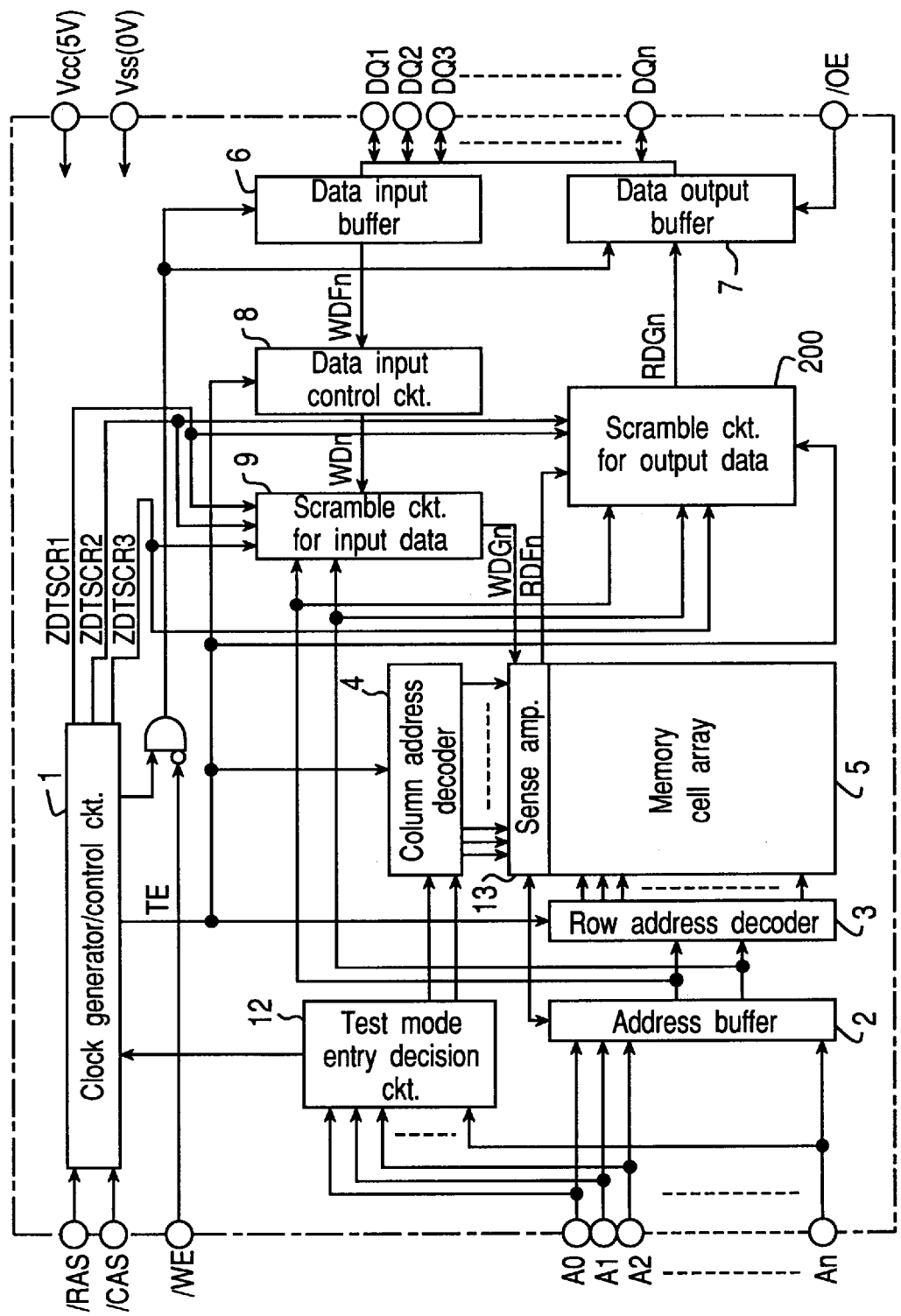
FIG. 9 shows a configuration of the DRAM according to Embodiment 3 of the semiconductor memory device of the present invention.

FIG. 9 is a block diagram showing the configuration of the DRAM of Embodiment 3 of the semiconductor memory device of the present invention. The DRAM of the present embodiment includes an output data scramble circuit 200 to reduce the degradation of the access time for reading data. The like reference numerals in FIGS. 1 and 9 indicate the same components.

Figure 10:
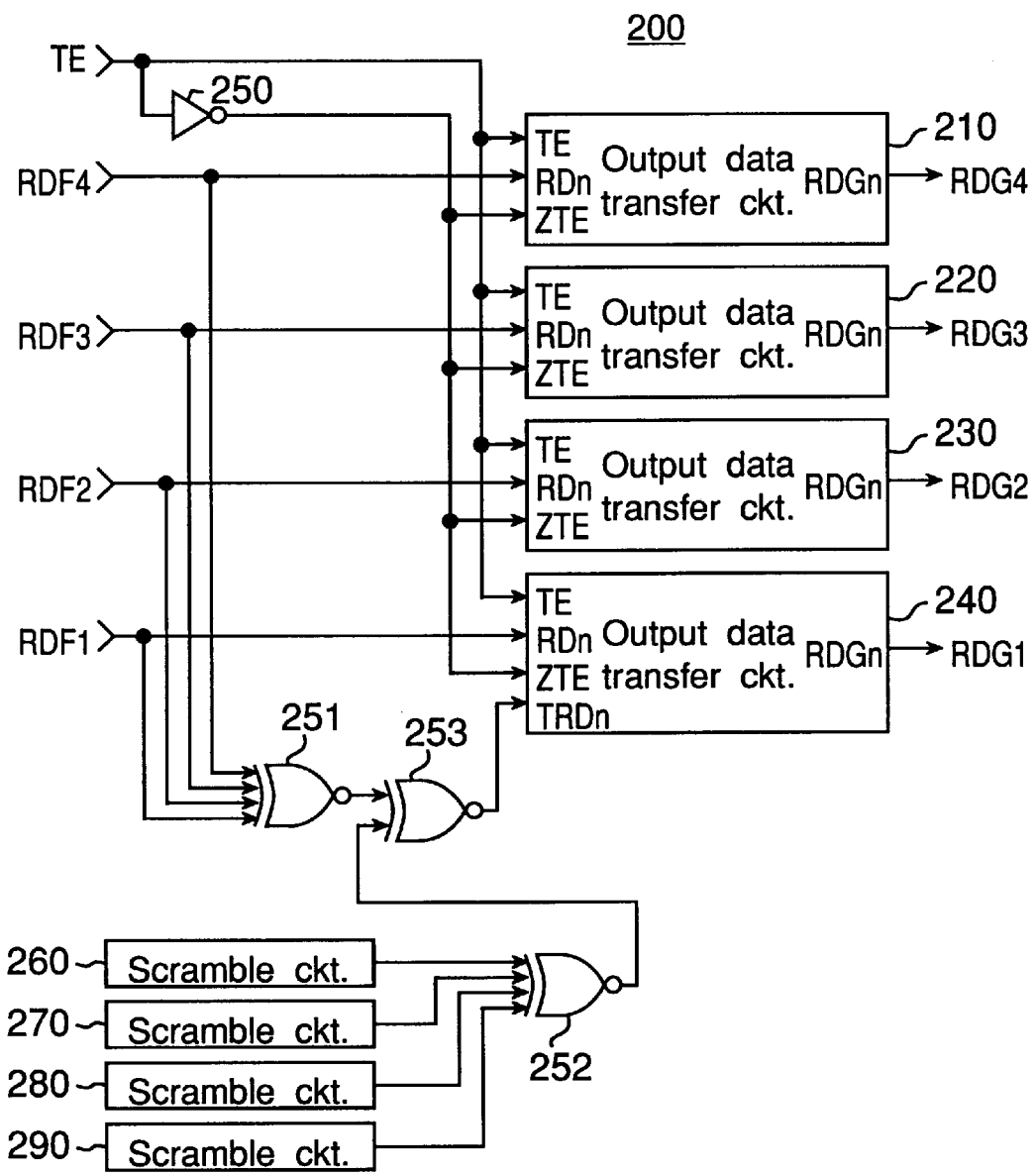
FIG. 10 shows a configuration of the output data scramble circuit.

FIG. 10 shows the configuration of the output data scramble circuit 200. The data signals RDF1–RDF4 retrieved from the memory cell array 5 and then received by the output data scramble circuit 200 are directly led to data transfer circuits 210, 220, 230, and 240, respectively, unlike the data signals received by the output data scramble circuit 11 and the input/output data scramble circuit 100 of Embodiments 1 and 2, in which the retrieved data of RDF1–RDF4 which have been scrambled are led to the EXOR gates to get decoded. Thus this configuration eliminates the delay in access time at the EXOR gate for decoding and shortens the overall access time in the normal mode. The data transfer circuits 210, 220, and 230 are the same as the circuits 160, 170, and 180 in FIG. 6. Also, the data transfer circuit 240 is the same as the circuit 150 in FIG. 6.

The data comparators for the test mode are configured as follows. Scramble circuits 260, 270, 280, and 290 in FIG. 10 each include the same circuits as the scramble logic portion 50 and the data scramble controller 60. The outputs from the scramble circuits are the same as those of the scramble controllers. The scramble circuits 260, 270, 280, and 290 may be simultaneously used for the input data as shown in FIG. 8.

As described referring to FIG. 3, in the scramble process, if the scramble data from the scramble circuit is "H", the input data is inverted , and if the scramble data from the scramble circuit is "L", the input data is output without change. In the case in which four input/output pins are reduced into one input/output pin, if correct data is retrieved from the memory cells, the number of the retrieved data among RDF1–RDF4 which have been inverted in the scramble process before being stored in the memory cell must be equal to the number of the "H" signals produced from the four scramble circuits. The data signals RDF1–RDF4 are provided to an EXNOR gate 251 for obtaining a signal corresponding to the number of the data which have been inverted by the scramble process. Similarly, the scramble data from the four scramble circuits 260, 270, 280, and 290 is provided to an EXNOR gate 252 for obtaining a signal corresponding to the number of the "H" signals among the signals output from the EXNOR gate 252. Then the outputs from the EXNOR gate 251 and the EXNOR gate 252 are provided to an EXNOR gate 253 and compared to determine if the two outputs are the same or not. The decision signal from the EXNOR gate 253 is sent to the input terminal TRDn of the output data transfer circuit 240. If the drive signal TE is "H", that is, the test mode is set, the output data transfer circuit 240 inverts the data provided to the input terminal TRDn and outputs it as a data signal of RDG1. This configuration is not only able to perform proper decisions on the data when the test mode is set but is also able to prevent the degradation of the read time when the test mode is not set.

The first semiconductor memory device of the present invention includes a circuit which performs the scramble process on each input/output pin. Therefore, it can perform the scramble process in which a desired pattern of "H" and "L" is written on the memory cells independently of the tester, based on the relationship between the order of the logical addresses and that of the physical addresses for each input/output pin, and even in the case in which a plural number of the input/output pins are reduced to one pin. Thus the first semiconductor memory device can perform an appropriate device test.

The second semiconductor memory device of the present invention has a circuit configuration in which retrieved data, when the test mode is not set, does not go through the scramble circuit. Therefore, it can prevent the degradation of the read speed which would be slower if the data passed through the scramble circuits.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device for writing data to and reading data from physical addresses of a memory cell array corresponding to logical addresses input externally, said semiconductor memory device comprises:
 a test mode set means for setting a memory test mode to said memory device; and
 a data scramble circuit for executing the test mode, when set by said test mode set means, by selectively inverting values of data externally input via input/output pins of said memory device in accordance with physical addresses corresponding to said logic addresses; and, upon reading data stored in said memory cell array, re-inverting inverted data based on the corresponding physical address information.

2. The semiconductor memory device as claimed in claim 1, wherein said data scramble circuit comprises:
 an input data scramble circuit for selectively inverting values of the input data in accordance with physical addresses corresponding to the input logical addresses, and,
 an output data scramble circuit for re-inverting values of the data inverted by said input data scramble circuit upon reading the data stored in said memory cell array.

3. The semiconductor memory device as claimed in claim 2, wherein said input data scramble circuit and output data scramble circuit are provided for each of said input/output pins of said memory device.

4. The semiconductor memory device as claimed in claim 3, wherein said input data scramble circuit is comprised of a logic circuit which logically determines whether each of data should be inverted or not in accordance with a physical address at which said each of data is written.

5. The semiconductor memory device as claimed in claim 3, wherein said input data scramble circuit is comprised of at least two logic circuits which determine in logically different ways whether each of data should be inverted or not in accordance with a physical address at which said each of data is written.

6. The semiconductor memory device as claimed in claim 3 further comprising:
 a data input control circuit for transferring data provided to one of said input/output pins in a group of a given number of input/output pins to each of the rest of said group when the test mode is set.

7. The semiconductor memory device as claimed in claim 6 further comprising a data output control circuit for determining whether the data reading operation has been performed properly or not from the data provided from said output data scramble circuit to the given number of input/output pins and for sending out a signal indicating the decision to one of the input/output pins in said group of the given number of input/output pins, when the test mode is set.

8. A semiconductor memory device for writing data to and reading data from physical addresses of a memory cell array corresponding to logical addresses input externally said semiconductor memory device comprises:
 a test mode setting means for setting the test mode;
 a data input control circuit for transferring data provided to one of the input/output pins in a group of a given number of input/output pins to each of the rest of said group when the test mode is set;
 a data scramble circuit for executing the test mode, when set by said test mode set means, by selectively inverting values of data provided by said data input control circuit in accordance with physical addresses corresponding to said logic addresses and, upon reading data stored in said memory cell array, re-inverting inverted data based on the corresponding physical address information.

9. The semiconductor memory device as claimed in claim 8, wherein said data scramble circuit comprises:
 an input data scramble circuit for selectively inverting values of the data provided by said data input control circuit in accordance with physical addresses corresponding to the input logical addresses; and,
 an output data scramble circuit for re-inverting values of the data inverted by said input data scramble circuit upon reading the data stored in said memory cell array.

10. The semiconductor memory device as claimed in claim 9, wherein said input data scramble circuit and output data scramble circuit are provided for each of said input/output pins of said memory device.

11. The semiconductor memory device as claimed in claim 10, wherein said input data scramble circuit is comprised of a logic circuit which logically determines whether each of data should be inverted or not in accordance with a physical address at which said each of data is written.

12. The semiconductor memory device as claimed in claim 10, wherein said input data scramble circuit is comprised of at least two logic circuits which determine in logically different ways whether each of data should be inverted or not in accordance with a physical address at which said each of data is written.

13. The semiconductor memory device as claimed in claim 10 further comprising:

a data input control circuit for transferring data provided to one of said input/output pins in a group of a given number of input/output pins to each of the rest of said group when the test mode is set.

* * * * *